United States Patent [19]

Levy

[11] Patent Number: 5,438,549
[45] Date of Patent: Aug. 1, 1995

[54] NONVOLATILE MEMORY WITH VOLATILE MEMORY BUFFER AND A BACKUP POWER SUPPLY SYSTEM

[75] Inventor: Markus A. Levy, Citrus Heights, Calif.

[73] Assignee: Intel Corporation, Santa Clara, Calif.

[21] Appl. No.: 202,438

[22] Filed: Feb. 28, 1994

[51] Int. Cl.[6] .............................................. G11C 5/14
[52] U.S. Cl. .................... 365/229; 365/185; 365/228; 365/900
[58] Field of Search ................ 365/185, 900, 228, 229

[56] References Cited

U.S. PATENT DOCUMENTS

| | | | |
|---|---|---|---|
| 4,853,560 | 8/1989 | Iwamura et al. | 307/296.1 |
| 4,901,283 | 2/1990 | Hanbury et al. | 365/222 |
| 4,908,790 | 3/1990 | Little et al. | 364/900 |
| 4,912,346 | 3/1990 | Mizuta | 307/475 |
| 4,916,662 | 4/1990 | Mizuta | 365/52 |
| 4,979,143 | 12/1990 | Takano et al. | 364/900 |
| 5,008,566 | 4/1991 | Hashimoto | 307/296.8 |
| 5,012,425 | 4/1991 | Brown | 364/464.02 |
| 5,099,453 | 3/1992 | Steele | 365/229 |
| 5,172,342 | 12/1992 | Gochi | 365/226 |
| 5,175,842 | 12/1992 | Totani | 395/425 |
| 5,184,031 | 2/1993 | Hayakawa et al. | 307/296.3 |
| 5,193,198 | 3/1993 | Yokouchi | 395/750 |
| 5,197,033 | 3/1993 | Watanabe et al. | 365/226 |
| 5,204,840 | 4/1993 | Mazur | 365/228 |
| 5,204,963 | 4/1993 | Noya et al. | 395/750 |
| 5,267,218 | 11/1993 | Elbert | 365/226 |
| 5,301,161 | 4/1994 | Landgraf et al. | 365/229 |
| 5,343,436 | 8/1994 | Suzuki | 365/229 X |
| 5,359,569 | 10/1994 | Fujita et al. | 365/229 |

OTHER PUBLICATIONS

-Catalyst Semiconductor, "CAT24C44/CAT24C44I, 256-Bit Serial Nonvolatile CMOS Static RAM," Catalyst Semiconductor 92/93 Data Book, pp. 10-17 through 10-25 (1992).

Primary Examiner—Do Hyun Yoo
Attorney, Agent, or Firm—Blakely, Sokoloff, Taylor & Zafman

[57] ABSTRACT

A memory device that resides on a single substrate includes a nonvolatile memory array. Control circuitry is coupled to the memory array for controlling memory operations with respect to the memory array. A volatile memory buffer is coupled to the control circuitry for buffering data that is to be written into the memory array. The control circuitry fetches the data from the memory buffer to store in the memory array. A power supply control circuit is provided for detecting loss of a power supply applied to the memory buffer and for coupling a backup power supply to the memory buffer when the power supply is disconnected from the memory buffer such that data integrity of the memory device is maintained.

14 Claims, 3 Drawing Sheets

NONVOLATILE MEMORY WITH VOLATILE MEMORY BUFFER AND A BACKUP POWER SUPPLY SYSTEM

FIELD OF THE INVENTION

The present invention pertains to the field of computer memories. More particularly, this invention relates to a nonvolatile memory that includes a volatile memory buffer and a backup power supply system such that when the main power is disconnected from the volatile memory buffer, the volatile memory buffer is powered by a backup power supply in order to maintain data integrity of the nonvolatile memory.

BACKGROUND OF THE INVENTION

One type of prior nonvolatile memory is flash erasable and electrically programmable read-only memory ("flash EPROM"). A prior flash EPROM can be programmed, and once programmed, the contents of the prior flash EPROM can be erased by electrical erasure. The prior flash EPROM may then be reprogrammed with new data.

One type of prior flash EPROM includes a volatile memory buffer within the memory chip. The internal volatile memory buffer is used to buffer data to be programmed into the prior flash EPROM. After buffering, the data is then written into the memory array of the prior flash EPROM. The buffer resides on the same substrate as the circuitry of the prior flash EPROM. As is known, a volatile memory is typically faster than a nonvolatile memory for the read and write operations. The use of the volatile memory buffer in the flash EPROM therefore increases the programming throughput of the flash EPROM by first buffering data in the volatile memory buffer. The volatile memory buffer also enables fast access to the buffered data by the write control circuit of the flash EPROM during of the programming data into the flash memory array.

Moreover, the volatile memory buffer can be a multiple page interleaved volatile memory buffer to achieve further increase in the programming throughput of the flash EPROM. The interleaved buffer allows one page of the buffer to be loaded with data while the data stored in another page of the buffer is programmed into the flash memory array.

Disadvantages are, however, associated with the prior flash EPROM that includes the on-chip volatile memory buffer. One disadvantage is that the buffered data stored in the volatile memory buffer is typically lost when the prior flash EPROM is disconnected from the power supply. Typically, when the entire volatile memory buffer or one page of the buffer is full of data, the write control circuit of the flash ERPOM then empties the buffer or the page of the buffer by programming the data into the memory array. When the buffer is not full or when the write control circuit is not requested to program the data stored in the buffer, the write control circuit does not program the data stored in the buffer into the memory array of the flash EPROM. If the power supply is then disconnected from the flash EPROM, the data buffered in the volatile memory buffer will be lost, which adversely affects data integrity of the flash EPROM.

It is known in the prior art that a computer system with a volatile memory device can include a backup power supply to power the volatile memory during a failure in the primary power supply. The volatile memory and the backup power supply are typically mounted within the computer system. When the computer system experiences a power loss, the volatile memory is connected to the backup power supply such that data can be retained in the volatile memory.

SUMMARY AND OBJECTS OF THE INVENTION

One of the objects of the present invention is to maintain data integrity of a memory device during loss of power, wherein the memory device includes a nonvolatile memory array and a volatile memory buffer.

Another object of the present invention is to allow data stored in an on-chip volatile memory buffer of a nonvolatile memory device to be maintained in the memory buffer during loss of power supply to the nonvolatile memory device.

Another object of the present invention is to allow data stored in an on-chip volatile memory buffer of a memory device to be programmed into the nonvolatile memory array of the memory device in the event of loss of power supply to the memory device.

A further object of the present invention is to provide a backup power supply system for a memory device that includes a volatile memory buffer and a nonvolatile memory array such that in the event of loss of power, the backup power supply system automatically turns on the backup power supply to ensure data integrity of the memory device.

A memory device that resides on a single substrate includes a nonvolatile memory array. Control circuitry is coupled to the memory array for controlling memory operations with respect to the memory array. A volatile memory buffer is coupled to the control circuitry for buffering data that is to be written into the memory array. The control circuitry fetches the data from the memory buffer to store in the memory array. A power supply control circuit is provided for detecting loss of a power supply applied to the volatile memory buffer and for coupling a backup power supply to the memory buffer when the power supply is disconnected from the memory buffer such that data integrity of the memory device is maintained.

Other objects, features, and advantages of the present invention will be apparent from the accompanying drawings and from the detailed description that follows below.

BRIEF DESCRIPTION OF THE DRAWINGS

The present invention is illustrated by way of example and not limitation to the FIGURES of the accompanying drawings, in which like references indicate similar elements and in which.

DETAILED DESCRIPTION

Figure 1:
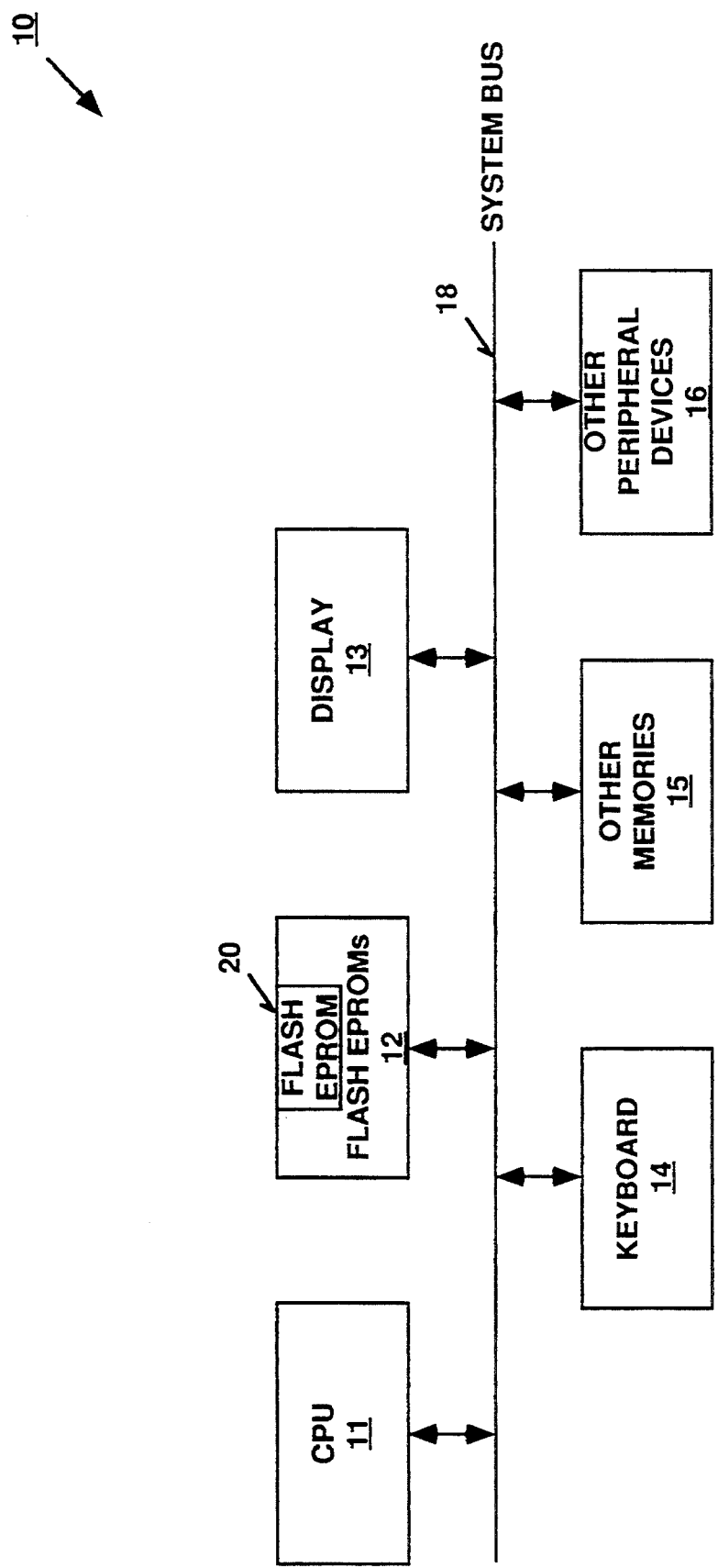
FIG. 1 is a block diagram of a computer system that includes a CPU and a flash EPROM.

FIG. 1 illustrates the architecture of a computer system 10 that includes a flash EPROM 20 that implements an embodiment of the present invention. Computer system 10 includes a bus 18 connected to a central processing unit ("CPU") 11, flash EPROMs 12, a display 13, a keyboard 14, and other memories 15. Flash EPROMs 12 include flash EPROM 20. Bus 18 is also connected to other peripheral devices 16. These other peripheral devices may include a modem, a serial communication controller, a local area network ("LAN"), and a parallel communication controller.

Figure 2:
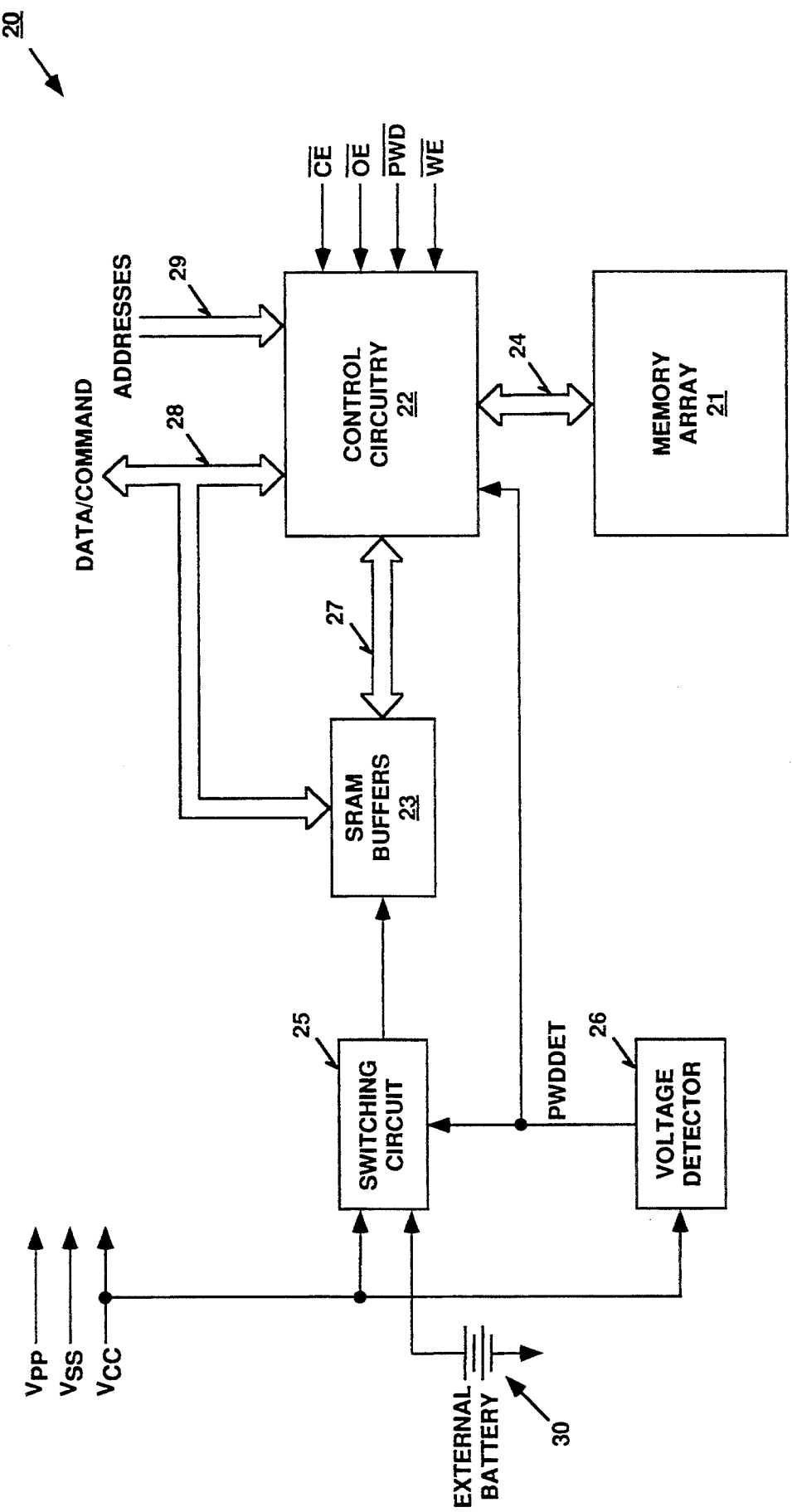
FIG. 2 is a block diagram of the flash EPROM that is used in the computer system of FIG. 1, wherein the flash EPROM includes static random access memory ("SRAM") buffers, a voltage detector, and a switching circuit.

FIG. 2 illustrates the circuitry of flash EPROM 20. Flash EPROM 20 includes a memory array 21, control circuitry 22 for controlling the memory operations of memory array 21, and static random access memory ("SRAM") buffers 23 for buffering data to be written into memory array 21.

Flash EPROM 20 further includes a voltage detector 26 for detecting loss of the power supply to flash EPROM 20 and a switching circuit 25 for coupling a backup power supply to SRAM buffers 23 when voltage detector 26 detects that the power supply to flash EPROM 20 is lost such that data integrity of flash EPROM 20 is maintained.

Memory array 21 of flash EPROM 20 is made up of flash EPROM cells that store data at addresses. For one embodiment, memory array 21 stores 16 Mbits ("megabits") of data. For alternative embodiments, memory array 21 can be smaller or larger than 16 Mbits.

For alternative embodiments, other types of memories can be substituted for flash EPROM 20. For example, an electrically erasable and programmable ready only memory ("EEPROM") or an electrically programmable read only memory ("EPROM") can be used. The present invention is especially desirable for the EEPROMs given that the EEPROMs generally program in granularities of the buffer size.

For one embodiment, memory array 21 is organized into bit line blocks by arranging bit lines into groups. For another embodiment, memory array 21 is organized into word line blocks by arranging word lines into groups.

For one embodiment, all the circuitry of flash EPROM 20 resides on a single substrate and flash EPROM 20 employs MOS circuitry.

Control circuitry 22 of flash EPROM 20 controls the memory operations with respect to memory array 21 via bus 24. The memory operations of flash EPROM 20 include read, programming, and erasure. Control circuitry 22 receives data read from memory array 21 and applies data to be written to memory array 21 via bus 24. Control circuitry 22 also provides configuration signals and other control signals to memory array 21 via bus 24.

Control circuitry 22 may include a specialized processor for controlling the memory operations of memory array 21. For one embodiment, the specialized processor included in control circuitry 22 is a specialized reduced instruction set processor. For alternative embodiments, the processor may be another type of processor of controller. Control circuitry 22 starts to control and perform the memory operations of flash EPROM 20 by first decoding memory operation commands received via bus 28.

Control circuitry 22 is connected to SRAM buffers 23 via bus 27. SRAM buffers 23 are also connected to data pins (not shown in FIG. 2) of flash EPROM 20 via bus 28. For alternative embodiments, SRAM buffers 23 can be other type of volatile memory. For example, SRAM buffers 23 can be a dynamic RAM ("DRAM").

SRAM buffers 23 are used to store programming data to be written to memory array 21. The data is first written into SRAM buffers 23 and then written from SRAM buffers 23 to flash memory array 21. This increases programming throughput of flash EPROM 20. SRAM is faster than the flash EPROM array for read and write operations. Data is first written into SRAM buffers 23 via bus 28. If SRAM buffers 23 are full of data or one page of buffers 23 is full of data, then control circuitry 22 fetches the data via bus 27 and programs the data into memory array 21.

The use of SRAM buffers 23 in flash EPROM provides a fast interface between memory array 21 of flash EPROM 20 and external circuitry (not shown) of computer system 10 of FIG. 1 that accesses memory array 21 of flash EPROM 20. This is due to the fact that SRAM buffers 23 are faster than memory array 21 of flash EPROM 20 for read and write operations. The use of SRAM buffers 23 in flash EPROM 20 thus enables fast programming of data to flash EPROM 20 by the external circuitry. The use of SRAM buffers 23 also enables fast access to the data by control circuitry 22 during programming of memory array 21 of flash EPROM 20. This in turn causes flash EPROM 20 to be fast in its memory operations.

Moreover, SRAM buffers 23 may be multiple page interleaved buffers. When SRAM buffers 23 are multiple page interleaved buffers, control circuitry 22 may start programming the programming data stored in one of page buffers 23 while another page buffer of buffers 23 is being loaded with the data. This also increases the programming throughput of flash EPROM 20.

Control circuitry 22 receives addresses for the memory operations from the external circuitry via bus 29. Data is applied to and received from flash EPROM 20 via bus 28. The memory operation commands are also applied to flash EPROM 20 via the data pins (not shown) and bus 28.

$V_{PP}$ is the program/erase power supply for flash EPROM 20. $V_{pp}$ is applied to a $V_{PP}$ pin of flash EPROM 20. $V_{CC}$ is the device power supply of flash EPROM 20 and $V_{SS}$ is ground. $V_{CC}$ is applied to a $V_{CC}$ pin of flash EPROM 20 and $V_{SS}$ is applied to a $V_{SS}$ pin of flash EPROM 20. $V_{CC}$ is generated external to flash EPROM 20 and is supplied to flash EPROM 20 via a system power supply (not shown) of computer system 10 of FIG. 1.

For one embodiment, $V_{PP}$ is approximately 12 volts and $V_{CC}$ is approximately 5 volts. For another embodiment, $V_{CC}$ is approximately 3 volts. For another embodiment, flash EPROM 20 does not require the $V_{PP}$ power supply. For this embodiment, flash EPROM 20 generates the $V_{PP}$ voltage internally.

Flash EPROM 20 includes three control signals coupled to control circuitry 22—namely, chip enable $\overline{CE}$, output enable $\overline{OE}$, and write enable $\overline{WE}$. The chip enable $\overline{CE}$ signal is used for device selection of flash EPROM 20. The output enable $\overline{OE}$ signal is the output control for flash EPROM 20 and is used to gate data from the data pins (not shown) of flash EPROM 20, dependent on device selection. The write enable $\overline{WE}$ signal allows writes to control circuitry 22 while the chip enable $\overline{CE}$ signal is active low.

Flash EPROM 20 also includes a power down $\overline{PWD}$ control signal coupled to control circuitry 22. The power down $\overline{PWD}$ control signal is an active power down control signal. A logically low $\overline{PWD}$ control signal causes flash EPROM 20 to enter the power down mode. When flash EPROM 20 enters the power down mode, all circuitry, except SRAM buffers 23, of flash EPROM 20 are powered off. When the $\overline{WD}$ control signal supplied at the $\overline{PWD}$ pin rises to the $V_{CC}$ voltage (i.e., logical high), flash EPROM 20 returns to its normal operational modes.

For alternative embodiments, flash EPROM 20 functions without some of the above-mentioned control signals.

Flash EPROM 20 further includes voltage detector 26 and switching circuit 25. Voltage detector 26 is coupled to the $V_{CC}$ voltage. Switching circuit 25 is also coupled to the $V_{CC}$ voltage. In addition, switching circuit 25 is coupled to an external backup battery 30. External backup battery 30 is external to flash EPROM 20 and is used to provide the backup power supply to SRAM buffers 23 when the $V_{CC}$ power supply is disconnected from flash EPROM 20. Switching circuit 25 is then connected to SRAM buffers 23 for supplying power to SRAM buffers 23.

For one embodiment, external backup battery 30 is supplied to switching circuit 25 via a reserved pin of flash EPROM 20. For another embodiment, external backup battery 30 is supplied to switching circuit 25 by multitasking the functionality of an existing functional pin of flash EPROM 20.

For one embodiment, battery 30 is a rechargeable battery. For another embodiment, battery 30 is a non-rechargeable battery. For one embodiment, battery 30 is a 5 volt battery. For another embodiment, battery 30 is a 3 volt battery.

Figure 3:
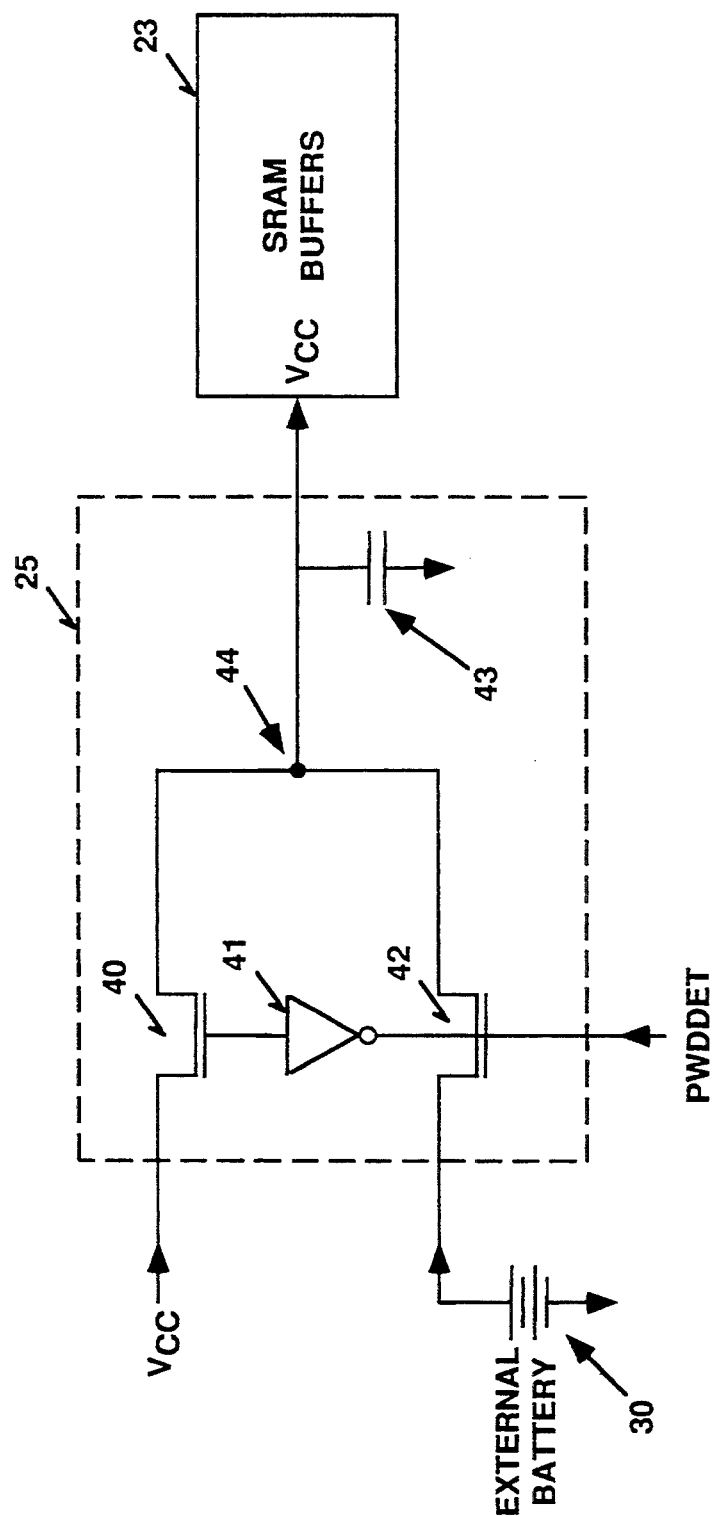
FIG. 3 is a circuit diagram illustrating the circuit of the switching circuit of FIG. 2.

Switching circuit 25 only connects one of the $V_{CC}$ power supply and external battery 30 to SRAM buffers 23. As can be seen from FIG. 2, switching circuit 25 only selectively connects external battery 30 to SRAM buffers 23 and external battery 30 is not connected to other circuits of flash EPROM 20. Switching circuit 25 is controlled by voltage detector 26 to selectively connect either the $V_{CC}$ power supply or external battery 30 to SRAM buffers 23. The circuit of switching circuit 25 is shown in FIG. 3, which will be described in more detail below.

Voltage detector 26 is used to detect loss of the $V_{CC}$ power supply of flash EPROM 20. Voltage detector 26 does this by detecting the voltage level of the $V_{CC}$ power supply. When voltage detector 26 detects that the voltage level of the $V_{CC}$ voltage is below a predetermined threshold voltage, voltage detector 26 determines that the $V_{CC}$ power supply to flash EPROM 20 is lost and generates a PWDDET switching signal to switching circuit 25. In response to the PWDDET signal, switching circuit 25 disconnects the $V_{CC}$ power supply from SRAM buffers 23 and simultaneously connects external battery 30 to SRAM buffers 23 such that data stored in SRAM buffers 23 can be retained in the event of loss of the $V_{CC}$ power supply to flash EPROM 20. This helps to ensure data integrity of flash EPROM 20.

For another embodiment, the PWDDET signal is also applied to control circuitry 22. When control circuitry 22 receives the active PWDDET signal from voltage detector 26, control circuitry 22 then starts its power down operation in which control circuitry 22 programs the data currently stored in SRAM buffers 23 into memory array 21 For this embodiment, control circuitry 22 includes a power generation circuit (not shown) that maintains the power supply to flash EPROM 20 until the power down operation is completed when the $V_{CC}$ power supply is disconnected from flash EPROM 20.

Voltage detector 26 can be any kind of known voltage detector and the circuit of voltage detector 26 will not be described in detail hereinafter in order not to unnecessarily obscure the description of the present invention. For one embodiment for which $V_{CC}$ is approximately 5 volts, the predetermined threshold voltage at which voltage detector 26 determines that the $V_{CC}$ power supply is lost is approximately 4.5 volts. For another embodiment for which $V_{CC}$ is approximately 3.3 volts, the predetermined threshold voltage at which voltage detector 26 determines that the $V_{CC}$ power supply is lost is approximately 3 volts.

When voltage detector 26 detects that the voltage level of the $V_{CC}$ power supply is at or above the predetermined threshold voltage, voltage detector 26 deasserts the PWDDET switching signal. The deasserted PWDDET signal then causes switching circuit 25 to disconnect external battery 30 from SRAM buffers 23 and to reconnect the $V_{CC}$ power supply to SRAM buffers 23.

The operation of voltage detector 26 and switching circuit 25 with respect to connecting external battery 30 to SRAM buffers 23 in the event that the $V_{CC}$ power supply is disconnected from flash EPROM 20 is described below. The $V_{CC}$ power supply is applied to flash EPROM 20. Both switching circuit 25 and voltage detector 26 receives the $V_{CC}$ power supply. Because voltage detector 26 does not detect that the $V_{CC}$ power supply is lost to flash EPROM 20, it does not generate the PWDDET switching signal to switching circuit 25. Switching circuit 25 in turn maintains the connection of the $V_{CC}$ power supply to SRAM buffers 23.

When the voltage detector 26 detects that the voltage level of the $V_{CC}$ voltage is below the predetermined threshold voltage, voltage detector 26 then asserts the PWDDET signal to switching circuit 25. Under the control of the asserted PWDDET signal from voltage detector 26, switching circuit 25 then switches the power supply to SRAM buffers 23 from the $V_{CC}$ power supply to external battery 30. This therefore helps to ensure data retention by SRAM buffers 23 in the event of loss of the $V_{CC}$ power supply to flash EPROM 20.

Voltage detector 26 continues to detect the voltage level of the $V_{CC}$ power supply. When voltage detector 26 detects that the voltage level of the $V_{CC}$ power supply is at or above the predetermined threshold voltage, it indicates that the $V_{CC}$ power supply is again resumed to flash EPROM 20. When this occurs, voltage detector 26 deasserts the PWDDET signal to switching circuit 25. Switching circuit 25 then switches the power supply to SRAM buffers 23 from external battery 30 to the $V_{CC}$ power supply.

Referring to FIG. 3, the circuit of switching circuit 25 of FIG. 2 is shown. As can be seen from FIG. 3, switching circuit 25 includes two field effect transistors 40 and 42. For one embodiment, transistors 40 and 42 are N-channel transistors. For another embodiment, transistors 40 and 42 are P-channel transistors. Transistors 40 and 42 are both switching transistors.

Transistor 40 has its drain coupled to the $V_{CC}$ power supply and its source coupled to a node 44. The gate of transistor 40 is coupled to receive the PWDDET signal from voltage detector 26 of FIG. 2 via an inverter 41. Transistor 42 has its drain coupled to external battery 30 and its source coupled to node 44. The gate of transistor 42 is coupled to receive the PWDDET signal from voltage detector 26 of FIG. 2. As can be seen from FIG. 3, transistors 40 and 42 are alternately turned on by the PWDDET signal.

Node 44 is coupled to the power supply input (i.e., the $V_{CC}$ input) of SRAM buffers 23. A capacitor 43 is also coupled between node 44 and ground. The use of capacitor 43 in switching circuit 25 is to smooth out any glitch that may occur at node 44 during switching between the $V_{CC}$ power supply and external battery 30. For example, when transistor 40 is turning off and transistor 42 is turning on, glitch may occur at node 44. This can be eliminated by connecting capacitor 43 to node 44.

As described above, the PWDDET signal alternately turns on transistors 40 and 42. When the PWDDET signal turns on transistor 40 via inverter 41, switching circuit 25 connects the $V_{CC}$ power supply to SRAM buffers 23. At this time, transistor 42 is turned off by the PWDDET signal.

When the PWDDET signal turns on transistor 42, switching circuit 25 connects external battery 30 to SRAM buffers 23. Transistor 40 is turned off by the PWDDET signal via inverter 41.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory device, comprising:
   (A) a nonvolatile memory array;
   (B) control circuitry coupled to the memory array for controlling operations of the memory array;
   (C) a volatile memory buffer coupled to the control circuitry for buffering data to be written into the memory array, wherein the control circuitry fetches the data from the memory buffer to store in the memory array;
   (D) a power supply control circuit coupled to the volatile memory buffer, a power supply, and a backup power supply for detecting loss of the power supply applied to the memory buffer and for coupling the backup power supply to the memory buffer when the power supply is disconnected from the memory buffer such that data integrity of the memory device is maintained, wherein the nonvolatile memory array, the control circuitry, the volatile memory buffer, and the power supply control circuit all reside on a single semiconductor substrate.

2. The memory device of claim 1, wherein the power supply control circuit further comprises
   (i) a voltage detector for detecting a potential level of the power supply, wherein the voltage detector detects the loss of the power supply when the voltage detector detects that the potential level of the power supply is below a first voltage state;
   (ii) a switching circuit controlled by the voltage detector for disconnecting the power supply from the memory buffer and for connecting the backup power supply to the memory buffer when the voltage detector detects that the potential level of the power supply is below the first voltage state.

3. The memory device of claim 2, wherein the backup power supply is a battery.

4. The memory device of claim 2, wherein the switching circuit disconnects the backup power supply from the memory buffer when the voltage detector detects that the potential level of the power supply is higher than the first voltage state.

5. The memory device of claim 2, wherein the switching circuit comprises field effect switching transistors.

6. The memory device of claim 1, wherein the control circuitry fetches the data from the memory buffer to store in the memory array when the memory buffer is full of the data or the control circuitry is requested to fetch the data from the memory buffer.

7. The memory device of claim 1, wherein the memory device is an electrically erasable and electrically programmable memory, wherein the volatile memory buffer is a static random access memory buffer.

8. A computer system, comprising:
   (A) a system bus;
   (B) a central processing unit (CPU) coupled to the system bus;
   (C) a plurality of peripheral devices, each of which being coupled to the system bus;
   (D) a memory device coupled to the system bus, wherein the memory device resides on a single semiconductor substrate, wherein the memory device further comprises
      (i) a nonvolatile memory array;
      (ii) control circuitry coupled to the memory array for controlling operations of the memory array;
      (iii) a volatile memory buffer coupled to the control circuitry for buffering data to be written into the memory array, wherein the control circuitry fetches the data from the memory buffer to store in the memory array; and
      (iv) a power supply control circuit coupled to the volatile memory buffer, a power supply, and a backup power supply for detecting loss of the power supply applied to the memory buffer and for coupling the backup power supply to the memory buffer when the power supply is disconnected from the memory buffer such that data integrity of the memory device is maintained, wherein the nonvolatile memory array, the control circuitry, the volatile memory buffer, and the power supply control circuit all reside on the single semiconductor substrate.

9. The computer system of claim 8, wherein the power supply control circuit further comprises
   (i) a voltage detector for detecting a potential level of the power supply, wherein the voltage detector detects the loss of the power supply when the voltage detector detects that the potential level of the power supply is below a first voltage state;
   (ii) a switching circuit controlled by the voltage detector for disconnecting the power supply from the memory buffer and for connecting the backup power supply to the memory buffer when the voltage detector detects that the potential level of the power supply is below the first voltage state.

10. The computer system of claim 9, wherein the backup power supply is a battery.

11. The computer system of claim 9, wherein the switching circuit disconnects the backup power supply from the memory buffer when the voltage detector detects that the potential level of the power supply is higher than the first voltage state.

12. The computer system of claim 9, wherein the switching circuit comprises field effect switching transistors.

13. The computer system of claim 8, wherein the control circuitry fetches the data from the memory buffer to store in the memory array when the memory buffer is full of the data or the control circuitry is requested to fetch the data from the memory buffer.

14. The computer system of claim 8, wherein the memory device is an electrically erasable and electrically programmable memory, wherein the volatile memory buffer is a static random access memory buffer.

* * * * *

UNITED STATES PATENT AND TRADEMARK OFFICE
CERTIFICATE OF CORRECTION

PATENT NO.   : 5,438,549
DATED        : August 1, 1995
INVENTOR(S)  : Levy et al.

It is certified that error appears in the above-identified patent and that said Letters Patent is hereby corrected as shown below:

In column 4 at line 40 delete "$V_{pp}$" and insert --$V_{PP}$--

Signed and Sealed this

Fifteenth Day of October, 1996

Attest:

BRUCE LEHMAN

Attesting Officer        Commissioner of Patents and Trademarks